(12) United States Patent
Chang et al.

(10) Patent No.: US 9,362,275 B1
(45) Date of Patent: Jun. 7, 2016

(54) SEMICONDUCTOR DEVICE WITH DUMMY GATE STRUCTURES

(71) Applicant: TAIWAN SEMICONDUCTOR MANUFACTURING CO., LTD., Hsinchu (TW)

(72) Inventors: Yu-Hao Chang, Su-ao Township (TW); Chang-Li Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/622,503

(22) Filed: Feb. 13, 2015

(51) Int. Cl.
*H01L 27/088* (2006.01)
*H01L 29/40* (2006.01)
*H01L 29/423* (2006.01)
*H01L 27/02* (2006.01)
*H01L 21/8234* (2006.01)
*H01L 21/3213* (2006.01)
*H01L 29/06* (2006.01)
*H01L 29/66* (2006.01)
*H01L 21/762* (2006.01)

(52) U.S. Cl.
CPC ........ *H01L 27/088* (2013.01); *H01L 21/32139* (2013.01); *H01L 21/76224* (2013.01); *H01L 21/823437* (2013.01); *H01L 21/823481* (2013.01); *H01L 27/0207* (2013.01); *H01L 29/0649* (2013.01); *H01L 29/401* (2013.01); *H01L 29/42356* (2013.01); *H01L 29/66545* (2013.01)

(58) Field of Classification Search
None
See application file for complete search history.

(56) References Cited

U.S. PATENT DOCUMENTS

| 8,643,069 | B2 * | 2/2014 | Hsu | H01L 21/28123 257/288 |
|---|---|---|---|---|
| 2003/0001155 | A1 * | 1/2003 | Kotani | G03F 1/36 257/48 |
| 2006/0163665 | A1 * | 7/2006 | Chuang | H01L 21/823437 257/374 |
| 2012/0083094 | A1 * | 4/2012 | Jensen | H01L 21/31053 438/424 |
| 2012/0258592 | A1 * | 10/2012 | Chen | H01L 21/32139 438/666 |
| 2013/0246983 | A1 * | 9/2013 | Blatchford | H01L 21/28123 716/55 |
| 2014/0106538 | A1 * | 4/2014 | Wang | H01L 21/324 438/424 |

* cited by examiner

*Primary Examiner* — Joseph Schoenholtz
(74) *Attorney, Agent, or Firm* — Maschoff Brennan

(57) ABSTRACT

A semiconductor and a method for manufacturing the semiconductor device are provided. A semiconductor substrate is provided. A first oxide layer is formed over an active region. A first STI is formed to adjoin a first side of the active region, and a second STI is formed to adjoin a second side of the active region. A gate layer is formed over the first STI, the second STI and the first oxide layer. A masking element is formed over the gate layer. The gate layer is etched using the masking element to form a first gate electrode over the first oxide layer, a first dummy gate electrode over the first STI, and a second dummy gate electrode over the second STI. A width of the first gate electrode is smaller than a width of the first dummy gate electrode and a width of the second dummy gate electrode.

18 Claims, 8 Drawing Sheets

SEMICONDUCTOR DEVICE WITH DUMMY GATE STRUCTURES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. During the scaling trend, some photolithography enhancement techniques such as optical proximity correction (OPC), phase-shift mask (PSM), and off-axis illumination have been developed to compensate for image errors or to improve image resolution.

Generally, a semiconductor device such as a metal oxide semiconductor (MOS) device is constructed by a gate, a source and a drain. In some applications, a dummy gate is disposed near the gate to homogenize the optical proximity effect caused by light diffraction. However, the dummy gate may be peeled and thus damage the gate. Therefore, there is a need to solve the above deficiencies/problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
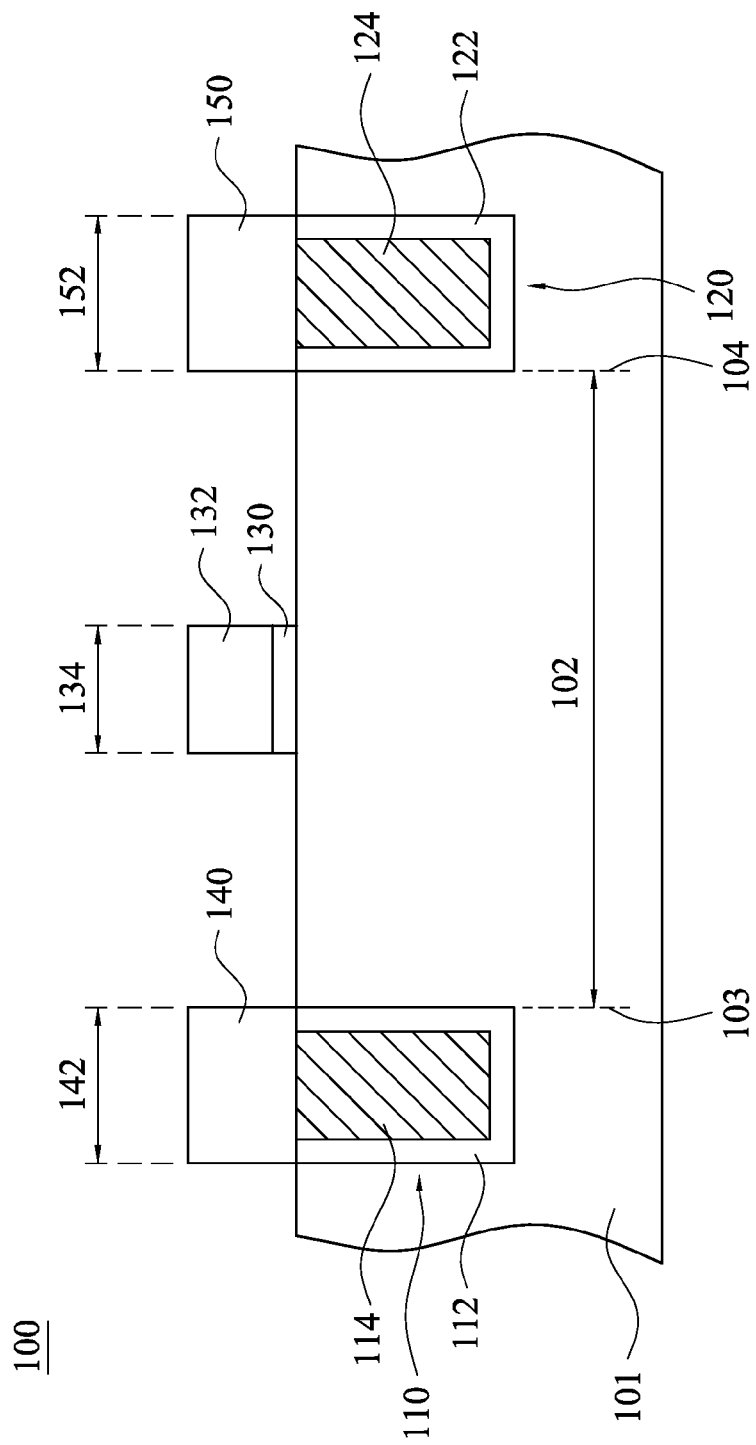
FIG. 1 is a schematic cross-sectional diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are directed to a semiconductor device such as a signal processing device or a logic device. The semiconductor device includes at least one electrode gate and more than one dummy gate electrodes. The electrode gate is located between the dummy gate electrodes. In particular, the widths of the dummy gate electrodes are greater than a width of the gate electrode. Therefore, the dummy gate electrodes are less likely to be peeled to damage the electrode gate and thus the yield of the semiconductor device is improved.

FIG. 1 is a schematic cross-sectional diagram of a semiconductor device in accordance with some embodiments of the present disclosure. As shown in FIG. 1, the semiconductor 100 includes a semiconductor substrate 101, a first shallow trench isolation (STI) 110, a first dummy gate electrode 140, a second STI 120, a second dummy gate electrode 150, a first oxide layer 130 and a first gate electrode 132.

In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate may have a gradient SiGe feature in which the Si and Ge compositions change from one ratio at one location to another ratio at another location of the gradient SiGe feature. In certain embodiments, the alloy SiGe is disposed over a silicon substrate. In alternative embodiments, a SiGe substrate is strained. Furthermore, the semiconductor substrate 101 may be a semiconductor on insulator, such as a silicon on insulator (SOI), or a thin film transistor (TFT). In some embodiments, the semiconductor substrate 101 may include a doped epi layer or a buried layer. In certain embodiments, the compound semiconductor substrate may have a multi-layer structure, or the substrate may include a multi-layer compound semiconductor structure.

The semiconductor substrate 101 includes an active region 102 having a first side 103 and a second side 104 opposite to the first side 103. The first STI 110 adjoins the first side 103, and the second STI 120 adjoins the second side 104. The first STI 110 includes a trench liner 112 peripherally enclosed by the semiconductor substrate 101, and dielectric material 114 peripherally enclosed by the trench liner 112, and the second STI 120 includes a trench liner 122 and dielectric material 124 filling a second trench (not labeled). In some embodiments, the first trench and the second trench have respective depths in a range from about 100 Angstroms to about 5000 Angstroms. In some embodiments, the trench liner 112 and the trench liner 122 include at least one of silicon oxide ($SiO_2$), silicon nitride (e.g., SiN, $Si_3N_4$), and silicon oxynitride (e.g., SiON), for example, a stack structure of $SiO_2$/SiN, $SiO_2$/SiON, $SiO_2$/SiN/SiON, or $SiO_2$/SiON/SiN with a total thickness of about 0 Angstrom (if no trench liner) to about 200 Angstroms. The dielectric material 114 and 124 may include silicon oxide, silicon dioxide, carbon doped silicon dioxide, nitrogen doped silicon dioxide, germanium doped silicon dioxide, or phosphorus doped silicon dioxide. One skilled in the art understands that other insulation materials may be employed and deposited in the STI 110 and 120 so long as they serve a purpose of electrically isolating one device region from a neighboring one.

The first oxide layer 130 is disposed over the active region 102. In some embodiments, the first oxide layer 130 includes silicon oxide ($SiO_2$) formed by thermal processes. In other embodiments, the first oxide layer 130 may be a high-k dielectric material. The high-k dielectric layer may include hafnium oxide ($HfO_2$), TiO2, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

The first dummy gate electrode 140 is disposed over the first STI 110. The first electrode gate 132 is over the first oxide layer 130. The second dummy gate electrode 150 is over the second STI 120. In some embodiments, the dummy gate electrode 140 and 150 and the gate electrode 132 have respective thicknesses ranging from about 300 angstroms to about 1200 angstroms. Exemplary materials for the dummy gate electrodes 140 and 150 and the gate electrode 132 include polysilicon, silicon, metal, and/or other suitable materials. The first dummy gate electrode 140 has a width 142, the first gate electrode 132 has a width 134, and the second dummy gate electrode 150 has a width 152. In particular, the widths 142 and 152 are greater than the width 134. Consequently, the dummy gate electrodes 140 and 150 are less likely to be peeled to damage the gate electrode 132, and thus the yield of the semiconductor device 100 is improved. In some embodiments, the widths 142 and 152 are greater than the width 134 by 2%~20% of the width 134. In some embodiments, the width 134 is substantially in a range from 38 nm to 40.5 nm. In some embodiments, the dummy gate electrodes 140 and 150 are not electrically connected to any active device such as transistors.

Figure 2:
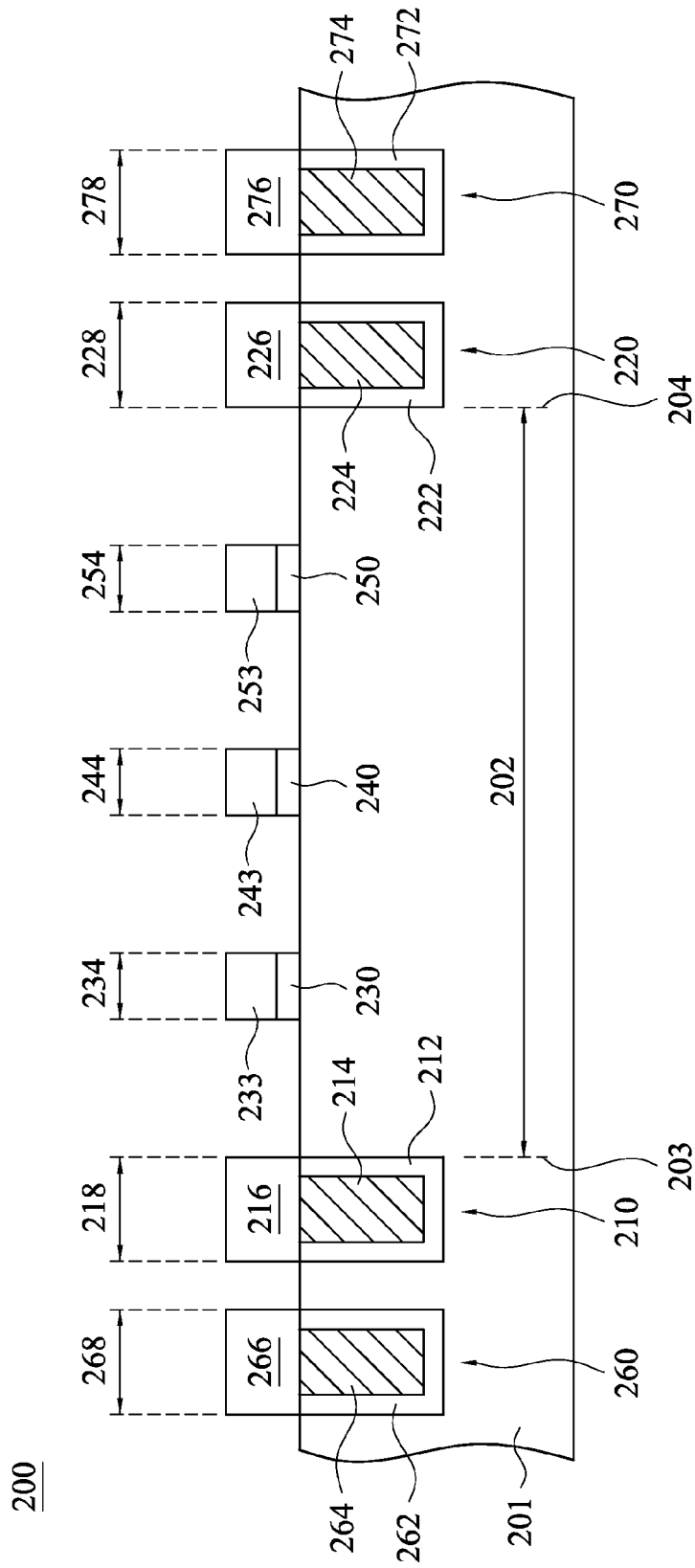
FIG. 2 is a schematic cross-sectional diagram of a semiconductor device in accordance with some embodiments of the present disclosure.

FIG. 2 is a schematic cross-sectional diagram of a semiconductor device in accordance with some embodiments of the present disclosure. As shown in FIG. 2, the semiconductor 200 includes a semiconductor substrate 201, a first STI 210, a second STI 220, a third STI 260, a fourth STI 270, a first dummy gate electrode 216, a second dummy gate electrode 226, a third dummy gate electrode 266, a fourth dummy gate electrode 276, a first oxide layer 230, a second oxide layer 240, a third oxide layer 250, a first gate electrode 233, a second gate electrode 243, and a third gate electrode 253.

In some embodiments, the substrate 201 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate may have a gradient SiGe feature in which the Si and Ge compositions change from one ratio at one location to another ratio at another location of the gradient SiGe feature. In certain embodiments, the alloy SiGe is disposed over a silicon substrate. In alternative embodiments, a SiGe substrate is strained. Furthermore, the semiconductor substrate 201 may be a semiconductor on insulator, such as a silicon on insulator (SOI), or a thin film transistor (TFT). In some embodiments, the semiconductor substrate 201 may include a doped epi layer or a buried layer. In certain embodiments, the compound semiconductor substrate may have a multi-layer structure, or the substrate may include a multi-layer compound semiconductor structure.

The semiconductor substrate 201 includes an active region 202 having a first side 203 and a second side 204 opposite to the first side 203. The first STI 210 adjoins the first side 203, and the second STI 220 adjoins the second side 204. The third STI 260 is disposed next to the first STI 210 opposite to the active region 202. The fourth STI 270 is disposed next to the second STI 220 opposite to the active region 202. In some embodiments, the STI 210, 220, 260 and 270 have respective depths in a range from about 100 Angstroms to about 5000 Angstroms. Each of the STI 210, 220, 260 and 270 includes a trench liner peripherally enclosed by the semiconductor substrate 201 and dielectric material peripherally enclosed by the respective trench liner. In some embodiments, trench liners 212, 222, 262 and 272 include at least one of silicon oxide ($SiO_2$), silicon nitride (e.g., SiN, $Si_3N_4$), and silicon oxynitride (e.g., SiON), for example, a stack structure of $SiO_2$/SiN, $SiO_2$/SiON, $SiO_2$/SiN/SiON, or $SiO_2$/SiON/SiN with a total thickness of about 0 Angstrom (if no trench liner) to about 200 Angstroms. Dielectric material 214, 224, 264 and 274 may include silicon oxide, silicon dioxide, carbon doped silicon dioxide, nitrogen doped silicon dioxide, germanium doped silicon dioxide, or phosphorus doped silicon dioxide. One skilled in the art understands that other insulation materials may be employed and deposited in the STI 210, 220, 260 and 270 so long as they serve a purpose of electrically isolating one device region from a neighboring one.

The first oxide layer 230, the second oxide layer 240 and the third oxide layer 250 are disposed over the active region 202. In some embodiments, the oxide layers 230, 240 and 250 include silicon oxide ($SiO_2$) formed by thermal processes. In other embodiments, the oxide layers 230, 240 and 250 may be high-k dielectric material. The high-k dielectric layer may include hafnium oxide ($HfO_2$), $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

A first dummy gate electrode 216 is disposed over the first STI 210; a second dummy gate electrode 226 is disposed over the second STI 220; a third dummy gate electrode 266 is disposed over the third STI 260; a fourth dummy gate electrode 276 is disposed over the fourth STI 270. A first gate electrode 233 is disposed over the first oxide layer 230; a second gate electrode 243 is disposed over the second oxide layer 240; a third gate electrode 253 is disposed over the third oxide layer 250. In some embodiments, the dummy gate electrodes 216, 226, 266 and 276 and the gate electrodes 233, 243 and 253 have respective thicknesses ranging from about 300 angstroms to about 1200 angstroms. Exemplary materials for the dummy gate electrodes 216, 226, 266 and 276 and the gate electrodes 233, 243 and 253 include polysilicon, silicon, metal, and/or other suitable materials. The dummy gate electrodes 216, 226, 266 and 276 have widths 218, 228, 268 and 278 respectively. The gate electrodes 233, 243 and 253 have widths 234, 244 and 254 respectively. In particular, the widths 218, 228, 268 and 278 are greater than the widths 234, 244 and 254. Consequently, the dummy gate electrodes 216, 226, 266 and 276 are less likely to be peeled to damage the gate electrodes 233, 243 and 253, and thus the yield of the semiconductor device 200 is improved. In some embodiments, the widths 234, 244 and 254 are the same with the each other. In some embodiments, the widths 234, 244 and 254 are substantially in a range from 38 nm to 40.5 nm. In some embodiments, the widths 218, 228, 268 and 278 are greater than the width 234 (or 243, 254) by 2%~20% of the width 234 (or 244, 254). In some embodiments, the dummy gate electrodes 216, 226, 266 and 276 are not electrically connected to any active device such as transistors.

FIG. 3A to FIG. 3D are schematic cross-sectional views of intermediate stages showing a method for fabricating a semiconductor device 300 in accordance with some embodiments of the present disclosure. It should be understood that FIG. 3A to FIG. 3D are representative only and do not intend to limit the present invention. For example, it is understood that additional operations may be performed before, after, and/or during the intermediate stages. Moreover, the semiconductor device 300 may include various devices and features, such as additional transistors, resistors, capacitors, diodes, fuses, etc., but is simplified for a better understanding of the inventive concepts of the present disclosure.

Figure 3A:
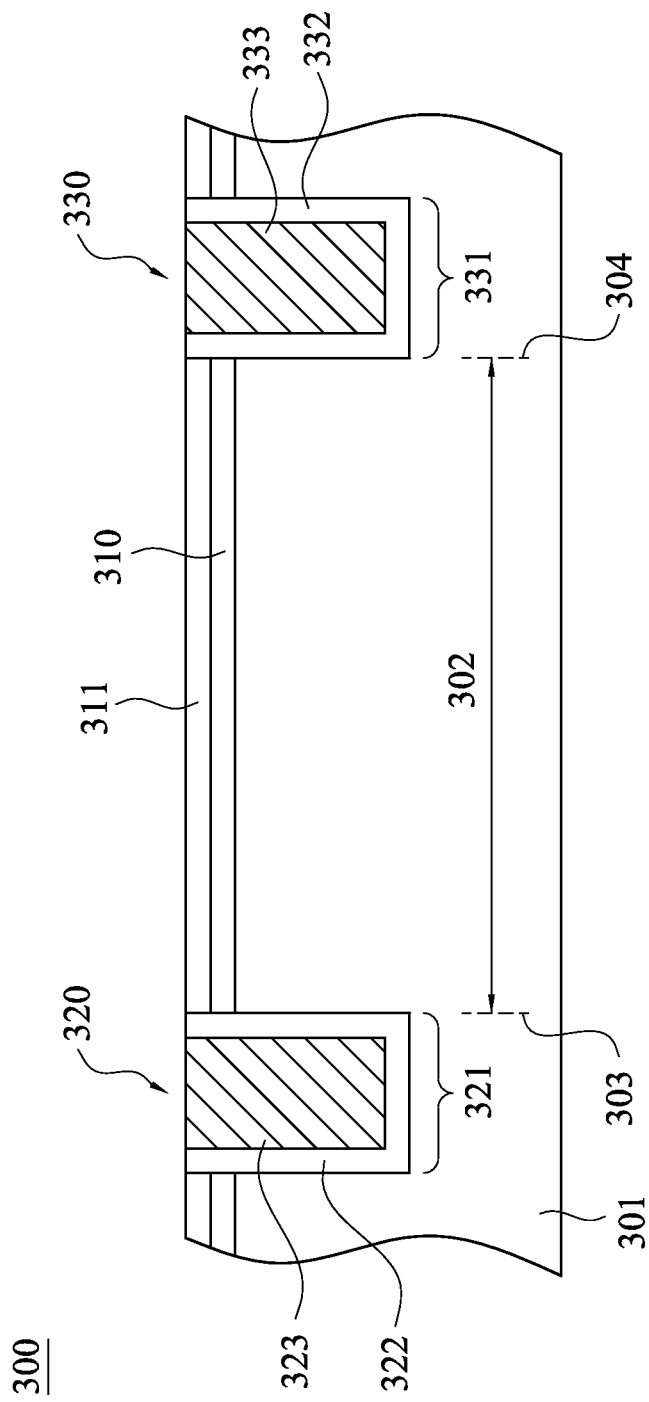
FIG. 3A to FIG. 3E are schematic cross-sectional views of intermediate stages showing a method for fabricating a semiconductor device in accordance with some embodiments of the present disclosure.

Referring to FIG. 3A, a semiconductor substrate 301 is provided. The semiconductor substrate 301 includes an active region 302 having a first side 303 and a second side 304 opposite to the first side 303. An oxide layer 310 is formed over the active region 302. A first STI 320 is formed to adjoin the first side 303, and a second STI 330 is formed to adjoins the second side 304. In some embodiments, the operations of forming the oxide layer 310 and forming the STI 320 and 330 are performed together. An exemplary formation process of the oxide layer 310, the STI 320 and the STI 330 is briefly discussed as follows.

First, the oxide layer 310 is formed on the semiconductor substrate 301. In some embodiments, the oxide layer 310 has a thickness ranging from about 50 angstroms to about 300 angstroms. Then, a hard mask 311 is formed on the oxide layer 310. In some embodiments, the hard mask 311 is formed from silicon nitride by a low pressure chemical vapor deposition (LPCVD) process. For example, a precursor including dichlorosilane (DCS or $SiH_2Cl_2$), bis (tertiary butylamino) silane (BTBAS or $C_8H_{22}N_2Si$), and disilane (DS or $Si_2H_6$) is used in the CVD process to form the hard mask 311. In some embodiments, the hard mask 311 has a thickness ranging from about 400 angstroms to about 1500 angstroms.

Thereafter, trenches 321 and 331 (the spaces occupied by STI 320 and 330) are formed. Photoresist deposition, lithography and resist development, etching, and post-etch resist removal are involved in forming the trenches 321 and 331. In some embodiments, etching chemistry, including for example, $Cl_2$, HBR, and $O_2$ is used to dry etch the semiconductor substrate 301 to form the trench 321 and 331. Then, trench liners 322 and 332 are formed conformal to the trenches 321 and 331. In some embodiment, the trenches liners 322 and 332 include at least one of silicon oxide ($SiO_2$), silicon nitride (e.g., SiN, $Si_3N_4$), and silicon oxynitride (e.g., SiON), for example, a stack structure of $SiO_2$/SiN, $SiO_2$/SiON, $SiO_2$/SiN/SiON, or $SiO_2$/SiON/SiN with a total thickness of about 0 Angstrom (if no trench liner) to about 200 Angstroms. The lining oxide may be formed by oxidation by using an oxygen gas, or oxygen containing gas mixture, to oxidized the silicon on the surface of the openings of the trenches 321 and 331. For example, the trench liners 322 and 332 may be formed by oxidizing the exposed silicon in an oxygen environment at a temperature from about 900° C. to about 1100° C. An annealing process may be performed after the trench liners 322 and 332 are deposited to prevent crystalline defects due to the oxidation process.

Thereafter, dielectric material 323 and 333 is filled into the remaining portion of the trenches 321 and 331 respectively. The dielectric material 323 and 333 may include silicon oxide, silicon dioxide, carbon doped silicon dioxide, nitrogen doped silicon dioxide, germanium doped silicon dioxide, or phosphorus doped silicon dioxide. One skilled in the art understands that other insulation materials may be employed and deposited in the STI 320 and 330 so long as they serve a purpose of electrically isolating one device region from a neighboring one. The filling of dielectric material 323 and 333 may be performed using high-density plasma chemical vapor deposition (HDPCVD). However, other commonly used methods, such as high aspect-ratio process (HARP), sub-atmospheric CVD (SACVD) and spin-on can also be used. A chemical mechanical polish (CMP) is then performed to remove excess dielectric material over the hard mask 311. Next, the hard mask 311 is removed.

Figure 3B:
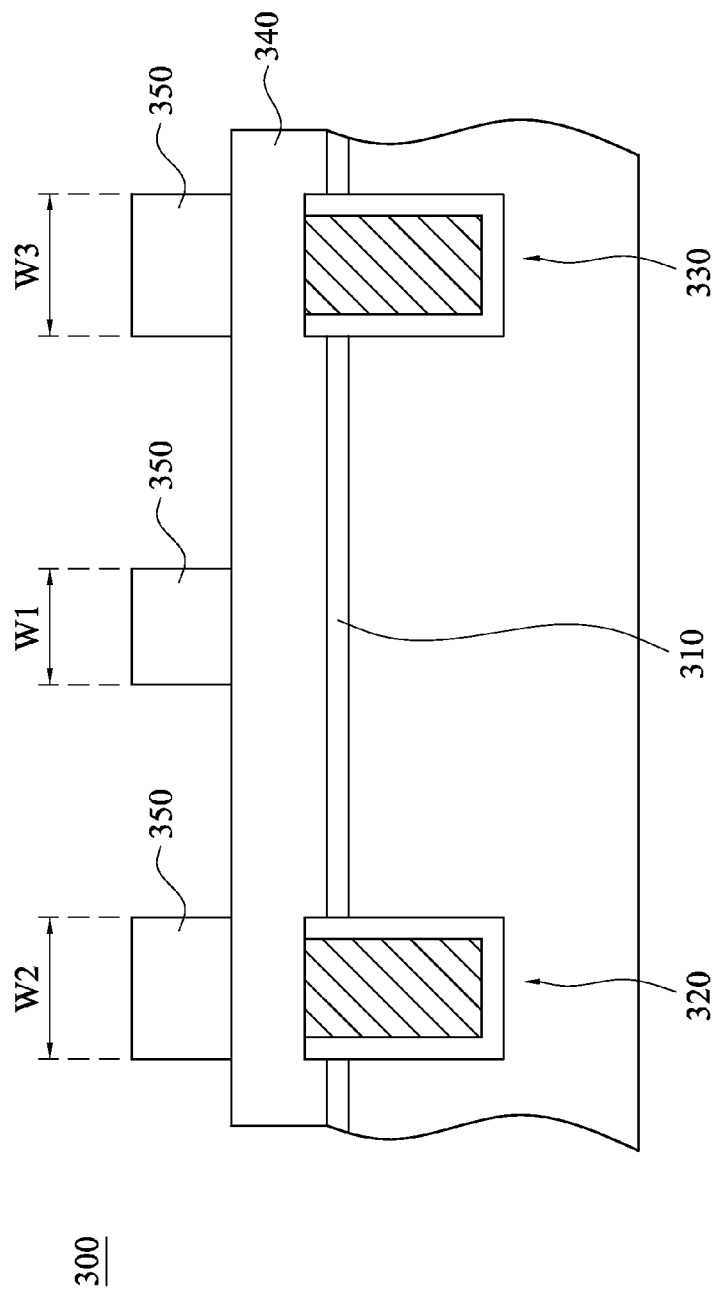

Referring to FIG. 3B, a gate layer 340 is then formed over the first STI 320, the second STI 330 and the oxide layer 310. In some embodiments, the gate layer 340 is made of polysilicon with a thickness in a range from about 300 angstroms to about 1200 angstroms. Next, a masking element 350 is formed over the gate layer 340. The masking element 350 may include photosensitive material (e.g., photoresist). The masking element 350 may be formed by forming a layer of photoresist, for example, by spin-on coating followed by patterning of the photoresist using suitable photolithography methods. In some embodiments, the photolithography methods include exposing the photoresist to a pattern (using a suitable radiation source), developing the exposed photoresist, baking process(s), cleaning process(es) and/or other suitable operations. In the embodiment of FIG. 3B, the masking element 350 is a patterned layer and the pattern of the masking element 350 has widths W1, W2 and W3, in which the widths W2 and W3 are greater than the width W1.

Figure 3C:
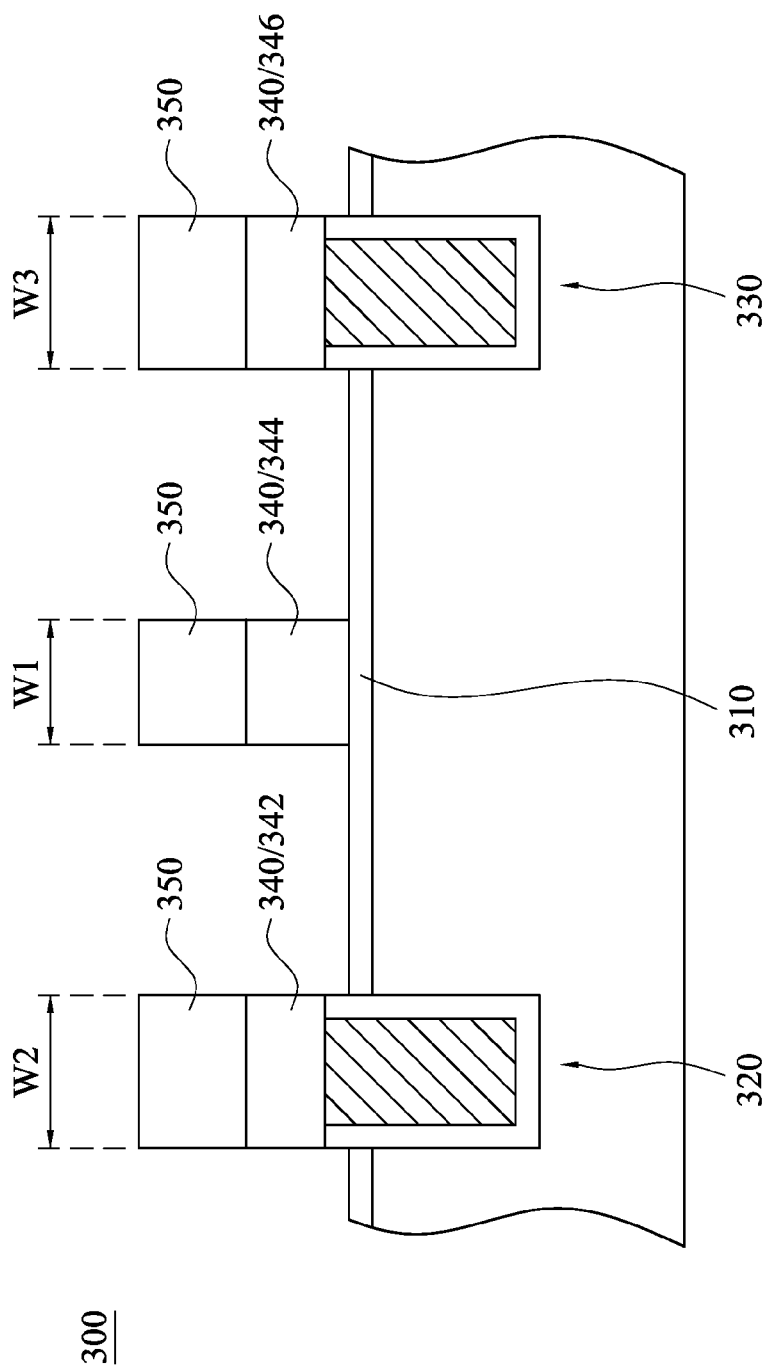
Figure 3D:
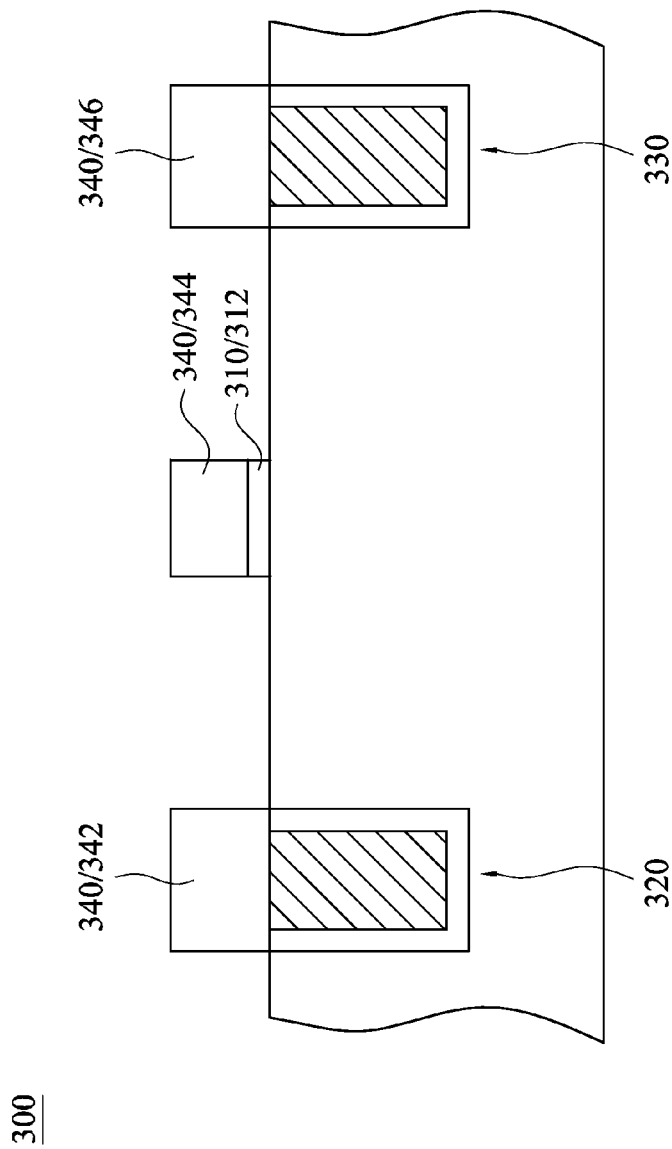

Referring to FIG. 3C, the gate layer 340 is etched using the masking element 350 to form a first gate electrode 344 over the oxide layer 310, a first dummy gate electrode 342 over the first STI 320, and a second dummy gate electrode 346 over the second STI 330. The etching may include dry etching (e.g., reactive ion etching, sputtering, vapor phase etching), plasma etching, and/or other suitable etching processes. Note that the width W1 of the first gate electrode 344 is smaller than the width W2 of the first dummy gate electrode 342 and the width W3 of the second dummy gate electrode 346. Therefore, the first dummy gate electrode 342 and the second dummy gate electrode 346 are less likely to be peeled. In some embodiments, the width W1 is substantially in a range from 38 nm to 40.5 nm. In some embodiments, the width W2 and the width W3 are greater than the width W1 by 2%~20% of the width W1. Next, the masking element 350 is removed, and the oxide layer 310 is patterned to form a first oxide layer 312 (see FIG. 3D).

Figure 3E:
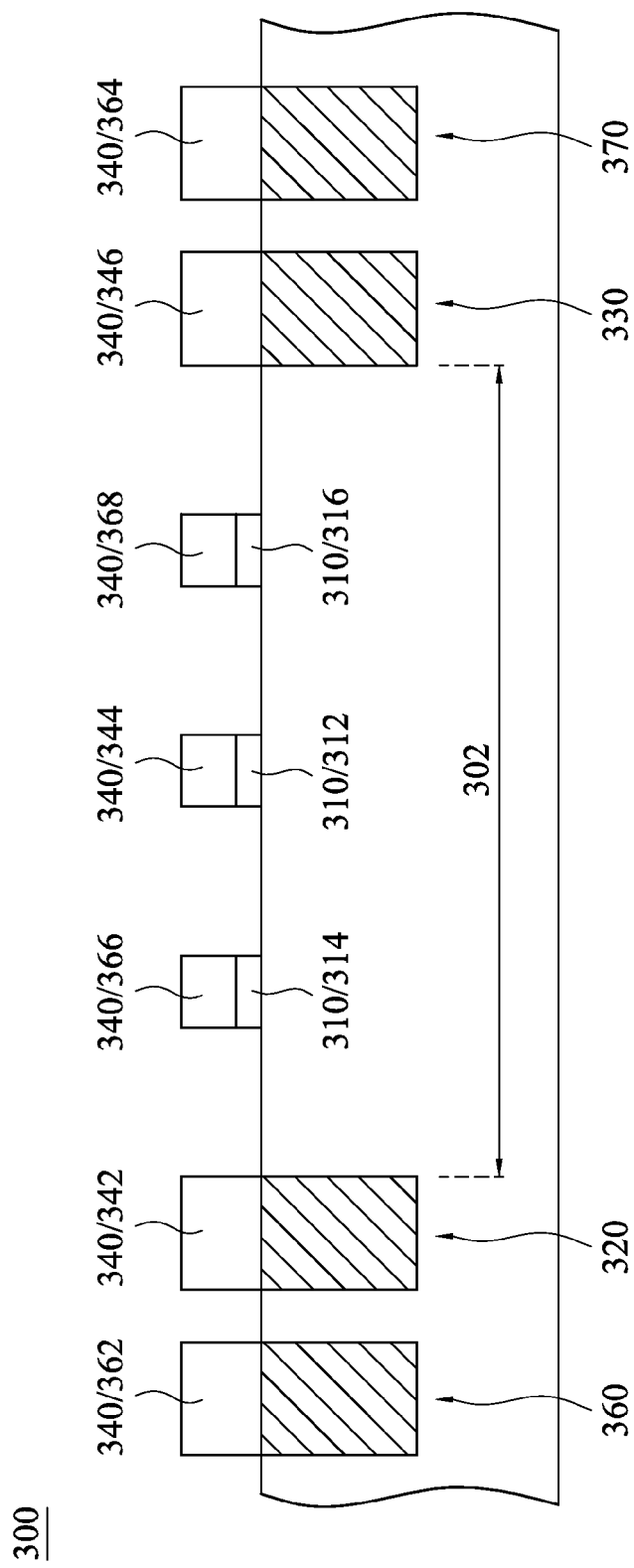

Referring to FIG. 3E, in some embodiments, the semiconductor device 300 has multiple gate electrodes in the active region 302 and multiple dummy gate electrodes at two sides of the active region 302. For example, before forming the gate layer 340, a third STI 360 is formed next to the first STI 320 opposite to the active region 302, a fourth STI 370 is formed next to the second STI 330 opposite to the active region 302. The operation of etching the gate layer 340 also forms a third dummy gate electrode 362 over the third STI 360, a fourth dummy gate electrode 364 over the fourth STI 370, a second gate electrode 366 over the oxide layer 310, and a third gate electrode 368 over the oxide layer 310. The oxide layer 310 is patterned to form a first oxide layer 312, a second oxide layer 314 and a third oxide layer 316. In some embodiments, the width of the third dummy gate electrode 362 and the width of the fourth dummy gate electrode 364 are greater than the width of the first gate electrode 344. In some embodiments, the width of the second gate electrode 366 and the width of the third gate electrode 368 are the same as the width of the first gate electrode 344. In some embodiments, the dummy gate electrodes 362 and 364 are not electrically connected to any active device such as transistors.

It should be understood that additional operations may be performed before, after, and/or during the intermediate stages of FIG. 3A to FIG. 3E. For example, sidewall spacers may be produced on the dummy gate electrodes 342, 346, 362 and 364. The dummy gate electrodes 342, 346, 362 and 364 may be etched and replaced with metal, and the metal herein are also referred to dummy gate electrodes.

Figure 4:
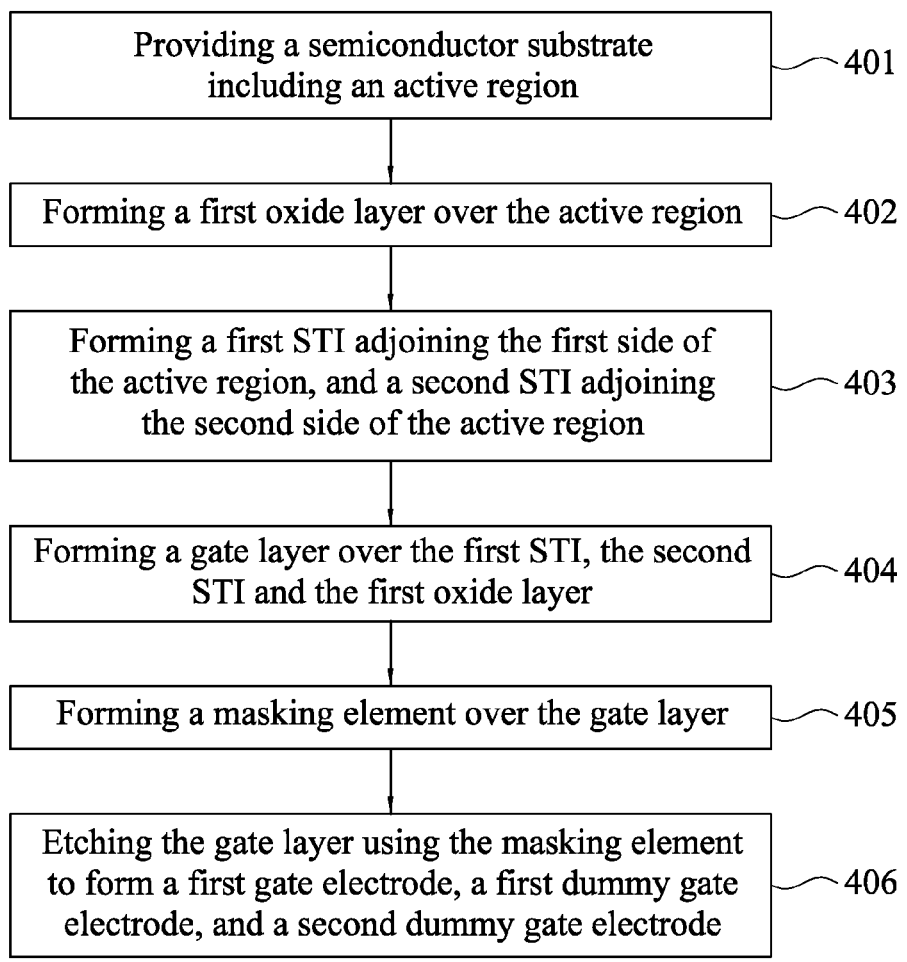
FIG. 4 is a flow chart of a method for fabricating a semiconductor device in accordance with some embodiments of the present disclosure.

Referring to FIG. 4 together with FIG. 3A to FIG. 3D, FIG. 4 is a flow chart of a method for fabricating a semiconductor device in accordance with some embodiments of the present disclosure. The method 400 begins at operation 401, where a semiconductor substrate 301 is provided. The semiconductor substrate 301 includes an active region 302 having a first side 303 and a second side 304 opposite to the first side 303. At operation 402, a first oxide layer 310/312 is formed over the active region 302. At operation 403, a first STI is formed to adjoin the first side 303 of the active region 302, and a second STI 330 is formed to adjoin the second side 304 of the active region 302. At operation 404, a gate layer 340 is formed over the first STI 320, the second STI 330 and the first oxide layer 310/312. At operation 405, a masking element 350 is formed over the gate layer 340. At operation 406, the gate layer 340 is etched using the masking element 350 to form a first gate electrode 344 over the first oxide layer 310/312, a first dummy gate electrode 342 over the first STI 320, and a second dummy gate electrode 346 over the second STI 330. In particular, the width W1 of the first gate electrode 344 is smaller than the width W2 of the first dummy gate electrode 342 and the width W3 of the second dummy gate electrode 346.

In some embodiments, a semiconductor device is provided. The semiconductor device includes a semiconductor substrate, a first (STI), a second STI, a first oxide layer, a first gate electrode, a first dummy gate electrode and a second dummy gate electrode. The semiconductor substrate has an active region having a first side and a second side opposite to the first side. The first STI adjoins the first side of the active region, and the second STI adjoins the second side of the active region. The first oxide layer is over the active region, and the first gate electrode is over the first oxide layer. The first dummy gate electrode is over the first STI, and the second dummy gate electrode is over the second STI. In particular, a width of the first dummy gate electrode and a width of the second dummy gate electrode are greater than a width of the first gate electrode.

In some embodiments, a method for manufacturing a semiconductor device is provided and includes following steps. A semiconductor substrate including an active region is provided, in which the active region has a first side and a second side opposite to the first side. A first oxide layer is formed over the active region. A first STI is formed to adjoin the first side of the active region, and a second STI is formed to adjoin the second side of the active region. A gate layer is formed over the first STI, the second STI and the first oxide layer. A masking element is formed over the gate layer. The gate layer is etched using the masking element to form a first gate electrode over the first oxide layer, a first dummy gate electrode over the first STI, and a second dummy gate electrode over the second STI. A width of the first gate electrode is smaller than a width of the first dummy gate electrode and a width of the second dummy gate electrode.

In some embodiments, a semiconductor device is provided. The semiconductor device includes a semiconductor substrate, four STIs, three oxide layers, three gate electrodes, and four dummy gate electrodes. The semiconductor substrate has an active region having a first side and a second side opposite to the first side. The first STI adjoins the first side of the active region, and the second STI adjoins the second side of the active region. The third STI is next to the first STI opposite to the active region, and the fourth STI is next to the second STI opposite to the active region. The dummy gate electrodes are formed over the STIs respectively. The oxide layers are over the active region, and the gate electrodes are over the oxide layers respectively. In particular, widths of the dummy gate electrodes are greater than widths of the gate electrodes, and the widths of the gate electrodes are the same with the each other.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
   a semiconductor substrate comprising an active region having a first side and a second side opposite to the first side;
   a first shallow trench isolation (STI) adjoining the first side of the active region;
   a second STI adjoining the second side of the active region;
   a first oxide layer over the active region;
   a first gate electrode over the first oxide layer wherein the width of the first gate electrode is substantially in the range from 38 nm to 40.5 nm;
   a first dummy gate electrode over the first STI, wherein a width of the first dummy gate electrode is greater than a width of the first gate electrode; and
   a second dummy gate electrode over the second STI, wherein a width of the second dummy gate electrode is greater than the width of the first gate electrode.

2. The semiconductor device of claim 1, wherein the width of the first dummy gate electrode and the width of the second dummy gate electrode are greater than the width of the first gate electrode by 2%~20% of the width of the first gate electrode.

3. The semiconductor device of claim 1, wherein the first dummy gate electrode and the second dummy gate electrode are not electrically connected to any active device.

4. The semiconductor device of claim 1, further comprising:
   a third STI next to the first STI opposite to the active region;
   a third dummy gate electrode over the third STI, wherein a width of the third dummy gate electrode is greater than the width of the first gate electrode;
   a fourth STI next to the second STI opposite to the active region; and
   a fourth dummy gate electrode over the fourth STI, wherein a width of the fourth dummy gate electrode is greater than the width of the first gate electrode.

5. The semiconductor device of claim 4, further comprising:
a second oxide layer over the active region;
a second gate electrode over the second oxide layer;
a third oxide layer over the active region; and
a third gate electrode over the third oxide layer.

6. The semiconductor device of claim 5, wherein a width of the second gate electrode is the same as the width of the first gate electrode.

7. The semiconductor device of claim 6, wherein a width of the third gate electrode is the same as the width of the first gate electrode.

8. A method for manufacturing a semiconductor device, the method comprising:
providing a semiconductor substrate comprising an active region having a first side and a second side opposite to the first side;
forming a first oxide layer over the active region;
forming a first shallow trench isolation (STI) adjoining the first side of the active region, and a second STI adjoining the second side of the active region;
forming a gate layer over the first STI, the second STI and the first oxide layer;
forming a masking element over the gate layer;
etching the gate layer using the masking element to form a first gate electrode over the first oxide layer, a first dummy gate electrode over the first STI, and a second dummy gate electrode over the second STI, wherein a width of the first gate electrode is smaller than a width of the first dummy gate electrode and a width of the second dummy gate electrode.

9. The method of claim 8, wherein the width of the first dummy gate electrode and the width of the second dummy gate electrode are greater than the width of the first gate electrode by 2%~20% of the width of the first gate electrode.

10. The method of claim 8, wherein the width of the first gate electrode is substantially in a range from 38 nm to 40.5 nm.

11. The method of claim 8, wherein the first dummy gate electrode and the second dummy gate electrode are not electrically connected to any active device.

12. The method of claim 8, wherein before the operation of forming the gate layer, the method further comprises:
forming a third STI next to the first STI opposite to the active region, and a fourth STI next to the second STI opposite to the active region,
wherein the operation of etching the gate layer further forms a third dummy gate electrode over the third STI and a fourth dummy gate electrode over the fourth STI, wherein a width of the third dummy gate electrode and a width of the fourth dummy gate electrode are greater than the width of the first gate electrode.

13. The method of claim 12, wherein before forming the gate layer, the manufacturing method further comprises:
forming a second oxide layer and a third oxide layer over the active region,
wherein the operation of etching the gate layer further forms a second gate electrode over the second oxide layer and a third gate electrode over the third oxide layer.

14. The method of claim 13, wherein the operation of etching the gate layer forms a width of the second gate electrode to be the same as the width of the first gate electrode.

15. The method of claim 14, wherein the operation of etching the gate layer forms a width of the third gate electrode to be the same as the width of the first gate electrode.

16. A semiconductor device, comprising:
a semiconductor substrate comprising an active region having a first side and a second side opposite to the first side;
a first shallow trench isolation (STI) adjoining the first side of the active region;
a second STI adjoining the second side of the active region;
a first oxide layer over the active region;
a first gate electrode over the first oxide layer wherein the width of the first gate electrode is substantially in the range from 38 nm to 40.5 nm;
a first dummy gate electrode over the first STI, wherein a width of the first dummy gate electrode is greater than a width of the first gate electrode;
a second dummy gate electrode over the second STI, wherein a width of the second dummy gate electrode is greater than the width of the first gate electrode;
a third STI next to the first STI opposite to the active region;
a third dummy gate electrode over the third STI, wherein a width of the third dummy gate electrode is greater than the width of the first gate electrode;
a fourth STI next to the second STI opposite to the active region;
a fourth dummy gate electrode over the fourth STI, wherein a width of the fourth dummy gate electrode is greater than the width of the first gate electrode;
a second oxide layer over the active region;
a second gate electrode over the second oxide layer, wherein a width of the second gate electrode is the same as the width of the first gate electrode;
a third oxide layer over the active region; and
a third gate electrode over the third oxide layer, wherein a width of the third gate electrode is the same as the width of the first gate electrode.

17. The semiconductor device of claim 16, wherein the width of the first dummy gate electrode and the width of the second dummy gate electrode are greater than the width of the first gate electrode by 2%~20% of the width of the first gate electrode.

18. The semiconductor device of claim 16, wherein the first dummy gate electrode, the second dummy gate electrode, the third dummy gate electrode and the fourth dummy gate electrode are not electrically connected to any active device.

* * * * *